United States Patent
Afentakis et al.

(10) Patent No.: US 11,228,311 B2
(45) Date of Patent: Jan. 18, 2022

(54) TOUCH-SENSITIVE ILLUMINATION

(71) Applicant: Peratech Holdco Ltd, Richmond (GB)

(72) Inventors: Themistoklis Afentakis, Camas, WA (US); Michael Robert Garrett, Stockholm (SE); Michael Dean Levin, Los Altos, CA (US); Joel Erik Christoffer Metelius, Nakca (SE)

(73) Assignee: Peratech Holdco Ltd, Richmond (GB)

( * ) Notice: Subject to any disclaimer, the term of this patent is extended or adjusted under 35 U.S.C. 154(b) by 0 days.

(21) Appl. No.: 16/976,571

(22) PCT Filed: Feb. 26, 2019

(86) PCT No.: PCT/GB2019/000034
§ 371 (c)(1),
(2) Date: Aug. 28, 2020

(87) PCT Pub. No.: WO2019/166755
PCT Pub. Date: Sep. 6, 2019

(65) Prior Publication Data
US 2021/0048184 A1   Feb. 18, 2021

Related U.S. Application Data

(60) Provisional application No. 62/637,524, filed on Mar. 2, 2018.

(30) Foreign Application Priority Data

Mar. 19, 2018   (GB) .................................. 1804352

(51) Int. Cl.
*H03K 17/96* (2006.01)
*F21V 23/04* (2006.01)
(Continued)

(52) U.S. Cl.
CPC ..... *H03K 17/9625* (2013.01); *F21V 23/0485* (2013.01); *F21V 23/06* (2013.01); *H05B 45/40* (2020.01); *H05B 47/115* (2020.01); *F21Y 2113/10* (2016.08); *F21Y 2115/10* (2016.08); *H03K 2217/96042* (2013.01)

(58) Field of Classification Search
None
See application file for complete search history.

(56) References Cited

U.S. PATENT DOCUMENTS

| | | | |
|---|---|---|---|
| 2007/0222763 A1* | 9/2007 | Spath | H01H 13/785 345/173 |
| 2012/0206403 A1* | 8/2012 | Wang | G06F 3/0412 345/174 |
| 2016/0004368 A1* | 1/2016 | Kurasawa | G06F 3/0416 345/174 |

FOREIGN PATENT DOCUMENTS

| | | | | |
|---|---|---|---|---|
| WO | 2007/107522 A1 | 9/2007 | | |
| WO | WO-2007107522 A1 * | 9/2007 | ............ | G01L 1/247 |

* cited by examiner

*Primary Examiner* — Crystal L Hammond
(74) *Attorney, Agent, or Firm* — Richard M. Goldberg

(57) ABSTRACT

Illumination functionality is combined with a touch-sensing functionality. A first electrical conductor and a second electrical conductor are located on a substrate. A pressure-sensitive element (113) is connected across the conductors and a light-emitting device (114) is also connected between the conductors. A control circuit alternates between energizing the pressure-sensitive element with current flowing in a first direction and driving the light-emitting device with current flowing in an opposite direction.

15 Claims, 8 Drawing Sheets

(51) Int. Cl.
*F21V 23/06* (2006.01)
*H05B 45/40* (2020.01)
*H05B 47/115* (2020.01)
*F21Y 113/10* (2016.01)
*F21Y 115/10* (2016.01)

TOUCH-SENSITIVE ILLUMINATION

CROSS REFERENCE TO RELATED APPLICATIONS

This application claims priority from U.S. 62/637,524 filed Mar. 2, 2018, which was granted a license to file outside of the United States on Mar. 6, 2018, and from GB 1804352.1 filed Mar. 19, 2018.

BACKGROUND OF THE INVENTION

The present invention relates to an apparatus for providing illumination. The present invention also relates to a method of combining an illumination functionality with a touch sensing functionality.

It is known to provide illumination, in which illuminating devices are connected between a pair of conductors to provide an illuminating strip. It is also known to provide control devices for controlling a degree of illumination. Control devices of this type often make use of a component having a variable resistance and touch sensitive devices are known that present a resistance that varies with a degree of applied pressure.

A known problem with illumination devices configured to provide illumination over a distributed area is that difficulties may arise in terms of identifying how to control the illumination devices. In particular, although the illumination devices may be distributed, the tendency is to provide a single point of contact for a control device. Thus, in many applications, specific devices must be added and, in some applications, these may be considered aesthetically undesirable.

BRIEF SUMMARY OF THE INVENTION

According to a first aspect of the present invention, there is provided an apparatus for providing illumination, comprising: a substrate; a first electrical conductor and a second electrical conductor supported by said substrate; a pressure-sensitive element connected across said first electrical conductor and said second electrical-conductor; a light-emitting device additionally connected between said first electrical conductor and said second electrical conductor; and a control circuit configured to: energize said pressure-sensitive element by applying electricity to said pressure-sensitive element of a first polarity; and drive said light-emitting-device by applying electricity to said light-emitting device of a second polarity, wherein said second polarity is opposite to said first polarity.

In an embodiment, the pressure-sensitive element is a variable resistive element, which is substantially non-conductive without an application of pressure.

According to a second aspect of the present invention, there is provided a method of combining an illumination functionality with a touch-sensing functionality, comprising the steps of: establishing a first electrical conductor and a second electrical conductor on a substrate; connecting a pressure-sensitive element across said first electrical conductor and said second electrical conductor; connecting a light-emitting device between said first electrical conductor and said second electrical conductor; and alternating, by means of a control-circuit, between: energizing said pressure-sensitive-element with current flowing in a first direction; and driving said light-emitting device with current flowing in an opposite direction.

Embodiments of the invention will be described, by way of example only, with reference to the accompanying drawings. The detailed embodiments show the best mode known to the inventor and provide support for the invention as claimed. However, they are only exemplary and should not be used to interpret or limit the scope of the claims. Their purpose is to provide a teaching to those skilled in the art.

DETAILED DESCRIPTION OF EMBODIMENTS OF THE INVENTION

FIG. 1

Figure 1:
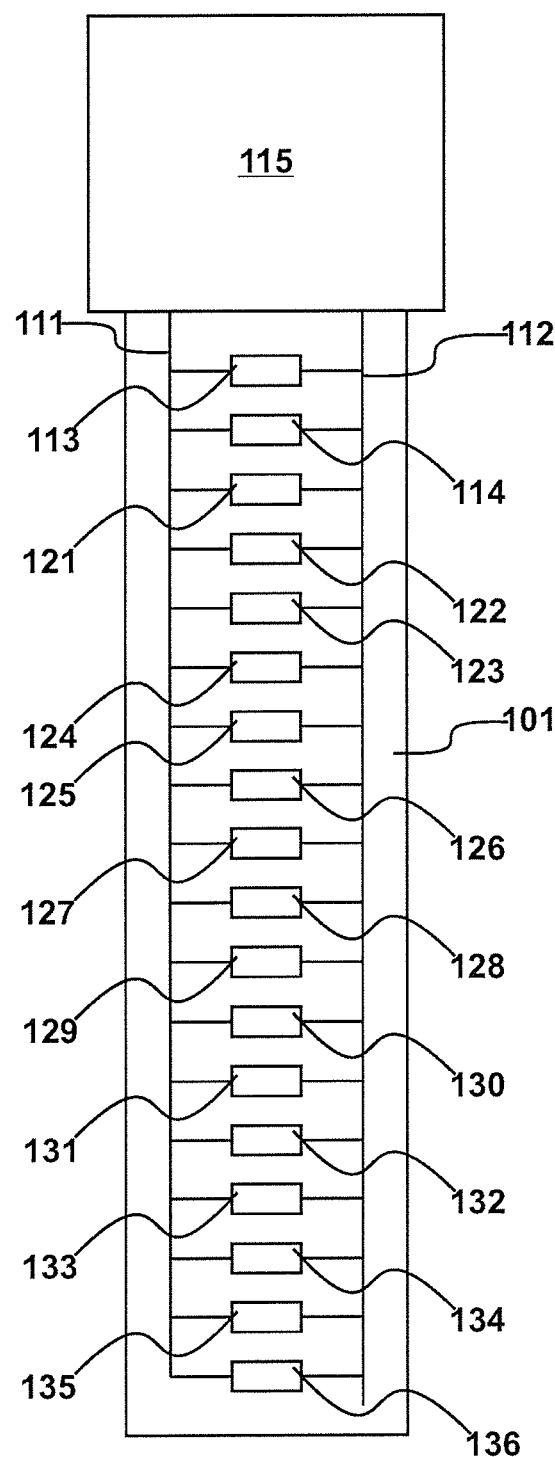
FIG. 1 shows an apparatus for providing illumination.

An apparatus for providing illumination is illustrated in FIG. 1. The apparatus includes a substrate 101 that may take the form of a dielectric strip. A first electrical conductor 111 and a second electrical conductor 112 are supported on the substrate 101. A pressure-sensitive element 113 is connected across the first electrical conductor and the second electrical conductor. In addition, a light-emitting device 114 is also connected between the first electrical conductor and the second electrical conductor.

A control circuit 115 is configured to produce an alternating output, to energize the pressure-sensitive element 113 by applying electricity to the pressure-sensitive element of a first polarity. Thereafter, the control circuit 115 drives the light-emitting device by applying electricity to the light-emitting device of a second polarity, wherein the second polarity is opposite to the first polarity. Thus, in this example, the pressure-sensitive element 113 is receptive to the application of pressure, and the light-emitting device 114 emits light when driven.

In the embodiment of FIG. 1, additional similar devices are connected between the first electrical conductor 111 and the second electrical conductor 112. Thus, FIG. 1 shows additional devices 121 to 136. Any of these devices may take the form of a pressure-sensitive element or a light-emitting device. In an embodiment, pressure-sensitive elements and light-emitting devices alternate but many other configurations are possible. For example, a greater number of light-emitting devices may be included to increase illumination or a greater number of touch-sensitive devices may be included to increase touch sensitivity.

FIG. 2

Figure 2:
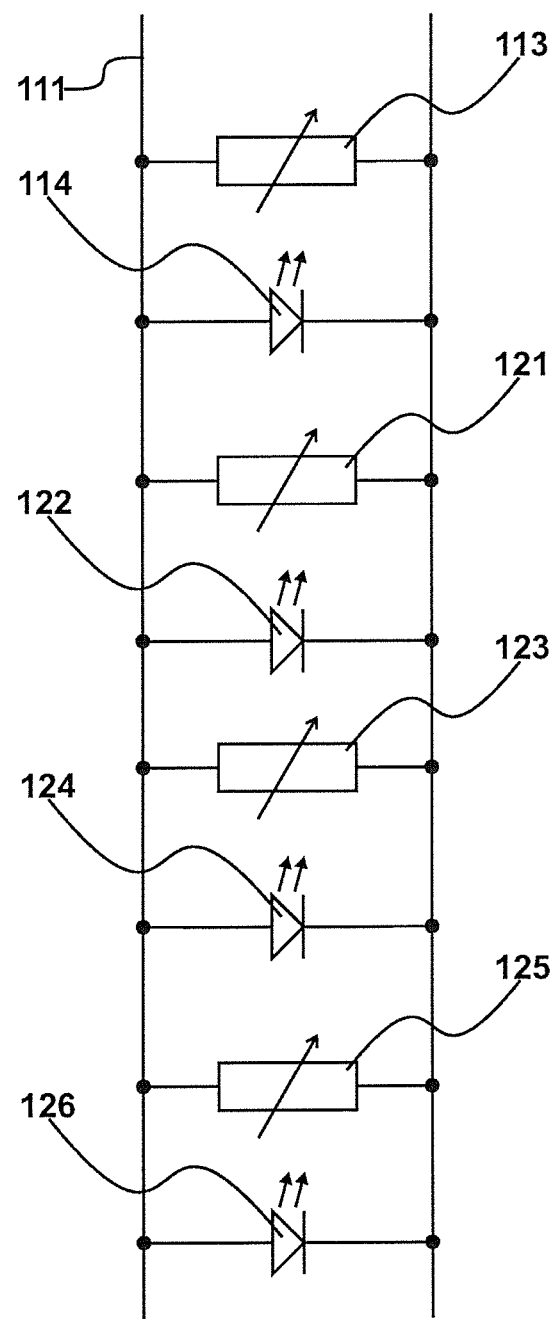
FIG. 2 shows a schematic representation of a circuit identified in FIG. 1.

A schematic representation of the circuit on the substrate 101 is shown in FIG. 2. The pressure-sensitive element 113 and the light-emitting device 114 may be seen as forming a first cell, with a similar second cell built from devices 121, 122, a third cell from devices 123, 124 and a fourth cell from devices 125, 126. Thus, each of these cells is substantially similar.

In this embodiment, when the pressure-sensitive elements are being energized, a positive voltage is applied to the second electrical conductor 112. Under these conditions, the light-emitting devices, implemented as light-emitting diodes 114, 122, 124 and 126 are reverse biased and as such do not conduct. Consequently, only the pressure-sensitive elements 113, 121, 123 and 125 are energized and are responsive to the application of pressure.

The application of a voltage to the first electrical conductor 111 or to the second electrical conductor 112 alternates, such that a positive voltage is then applied to the first electrical conductor 111. Under these conditions, the light-emitting diodes are forward biased and as such conduct electricity. With sufficient current, the light-emitting-diodes emit light and present a relatively low resistance. In an embodiment, the pressure-sensitive elements, such as the first pressure-sensitive element 113, are variable resistive elements and are substantially non-conductive without an application of pressure. Thus, without an application of pressure, pressure-sensitive elements are energized but current flow is minimal.

When pressure is applied to a pressure-sensitive element, such as element 113, the pressure-sensitive element presents a low (conductive) resistance, resulting in current being allowed to flow. The control circuit 115 is configured to identify this current and thereby identify a touch. However, in an embodiment, the light-emitting devices present a resistance that is substantially lower than this conductive resistance when being driven by the control circuit.

FIG. 3

In an embodiment, the pressure-sensitive element may be a QTC detector that presents a resistance in the order of one thousand ohms when a full force is applied. Consequently, even when conducting, the conductivity is much lower than that of the light-emitting diodes, such that very little current flows through the sensors when the diodes are being illuminated; the light emitting diodes are not shunted out of circuit when a force is applied to make one or more of the elements conductive. However, it is possible that other pressure-sensitive devices could be used that present a substantially lower resistance when force is applied. Consequently, an alternative configuration is shown in FIG. 3.

Figure 3:
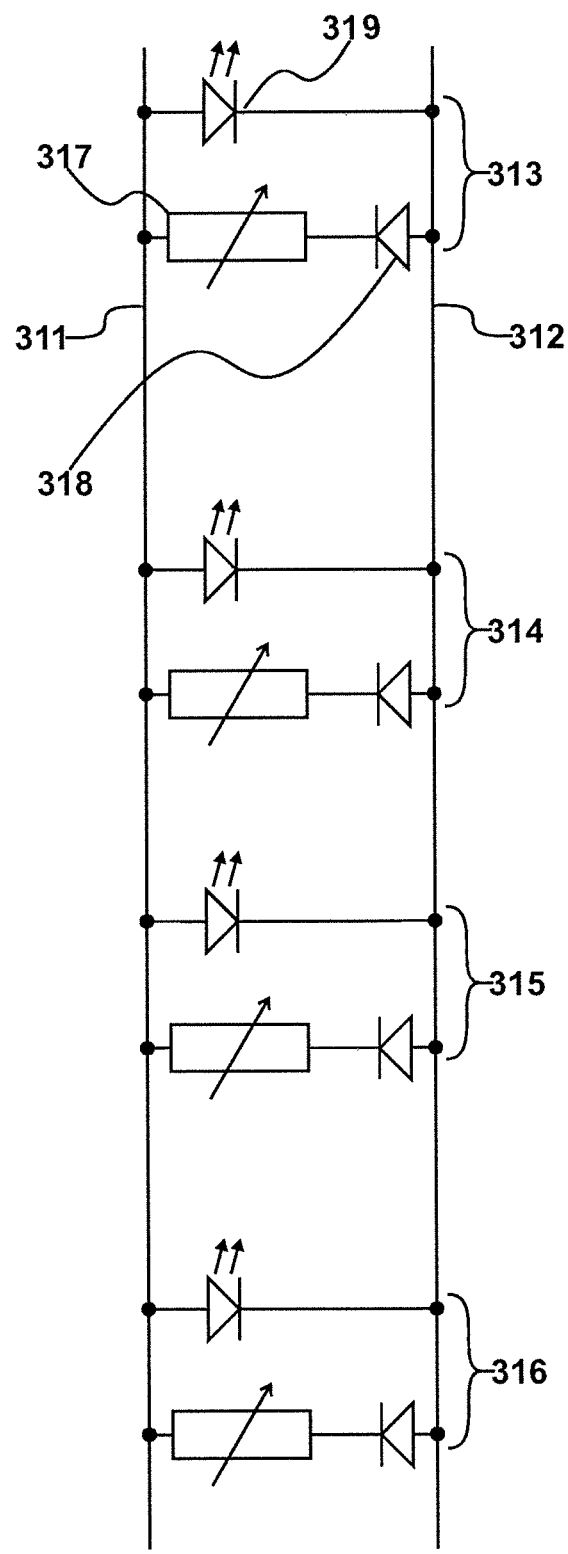
FIG. 3 shows an alternative schematic representation.
Figure 4:
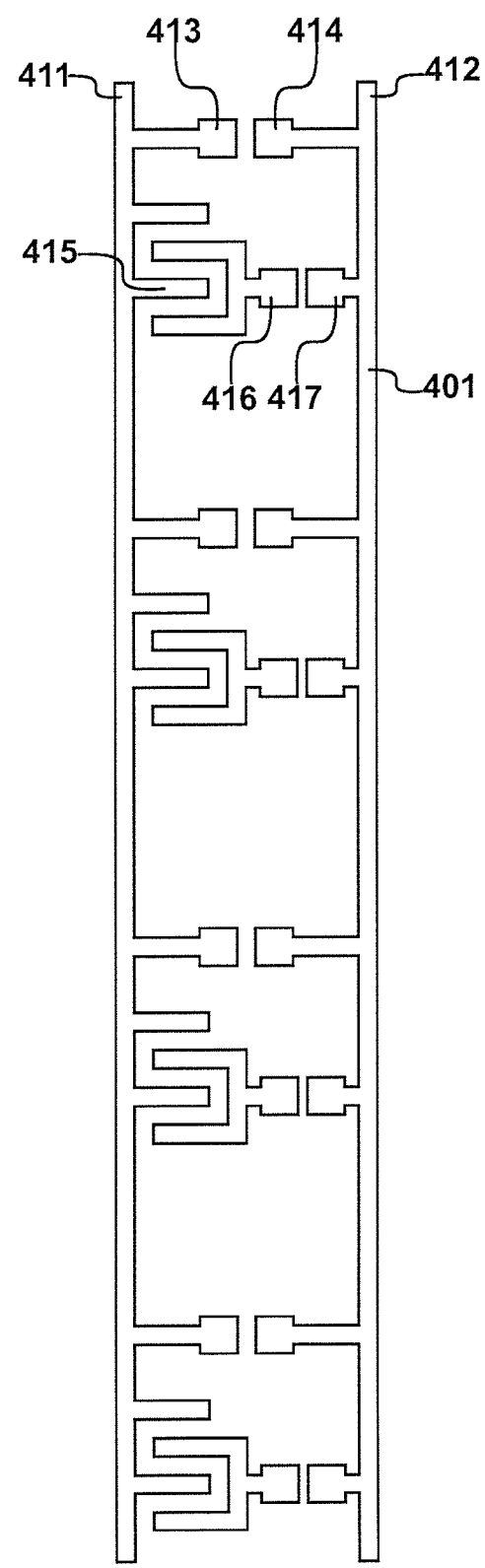
FIG. 4 illustrates tracks printed on a substrate.

In the schematic representation of FIG. 3, a first electrical conductor 311 is substantially similar to the first electrical conductor 111 and a second electrical conductor 312 is substantially similar to the second electrical conductor 112. A plurality of cells 313, 314, 315 and 316 are included, each comprising a light-emitting diode 319 that is substantially similar to light-emitting-diode 114. Thus, when a positive voltage is applied to the first electrical conductor 311, the light-emitting diodes 319 are illuminated.

The first cell 313 includes a pressure-sensitive device 317, which again has a conductance that increases with applied pressure. In this embodiment, it is possible that the resistance of the pressure-sensitive element may reduce to an extent that it effectively shorts-out the light emitting diodes when a positive voltage is applied to a first electrical conductor 311. In order to avoid this, the pressure-sensitive element 317 is connected in series with a conventional diode 318. Thus, conventional diode 318 is configured such that it is only conductive when a positive voltage is applied to the second electrical conductor 312.

FIG. 4

In an embodiment, silver tracks 401 are printed onto the substrate 101. In an alternative embodiment, the tracks may be printed in carbon. A first electrical track 411 is provided along with a second electrical track 412. Light emitting devices are bonded, using an adhesive or solder, onto a first pad 413 and a second pad 414. A QTC force sensing element contacts interdigitated electrodes 415. A conventional diode 318 is similarly bonded onto a third pad 416 and a fourth pad 417.

FIG. 5

Figure 5:
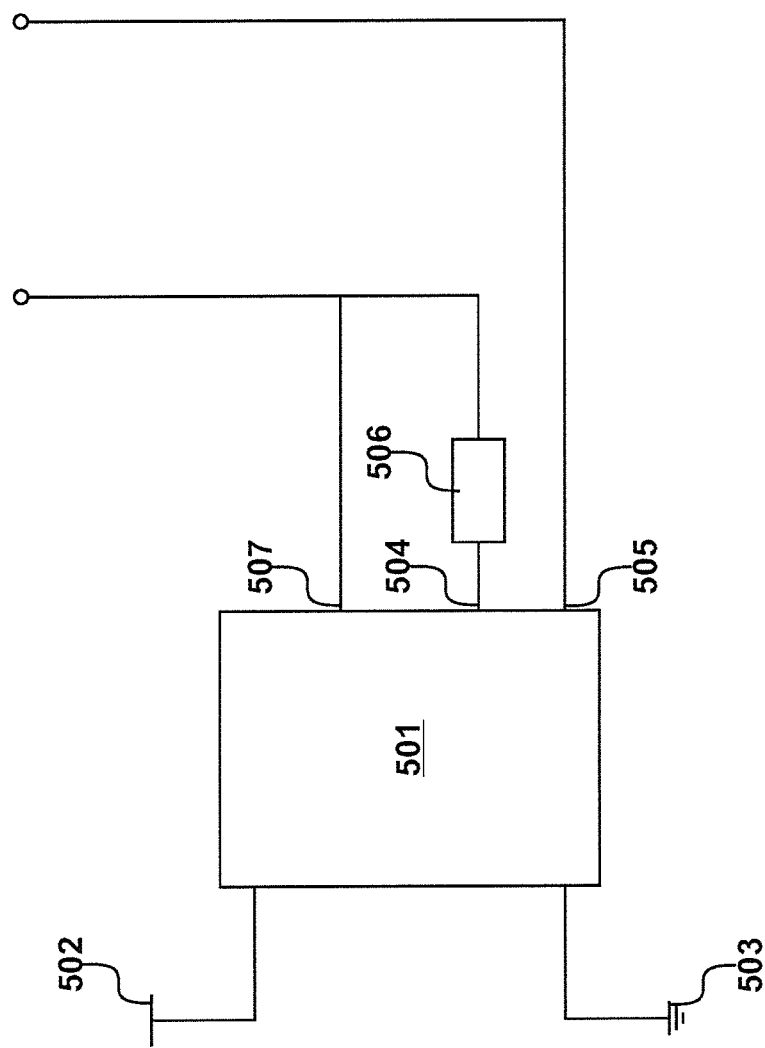
FIG. 5 shows an example of a control circuit of the type identified in FIG. 1.

An example of a control circuit 115 is shown in FIG. 5. A microcontroller 501 receives power from a positive rail 502 and the microcontroller is also connected to ground 503. To illuminate the light-emitting devices, a positive voltage is applied to an output port 504, with a similar port 505 connected to ground. A series resistor 506 provides current limiting for the light emitting devices.

In its alternative mode of operation, a positive voltage is applied to output port 505, which in turn energizes the pressure sensitive elements. When pressure is applied, current flows back to the first port 504 which now presents a ground connection. A third port 507 of the microcontroller 501 receives an indication of the voltage dropped across resistor 506 which is now providing a reference resistor forming part of a voltage divider with one or more conducting pressure sensitive elements.

FIG. 6

Figure 6:
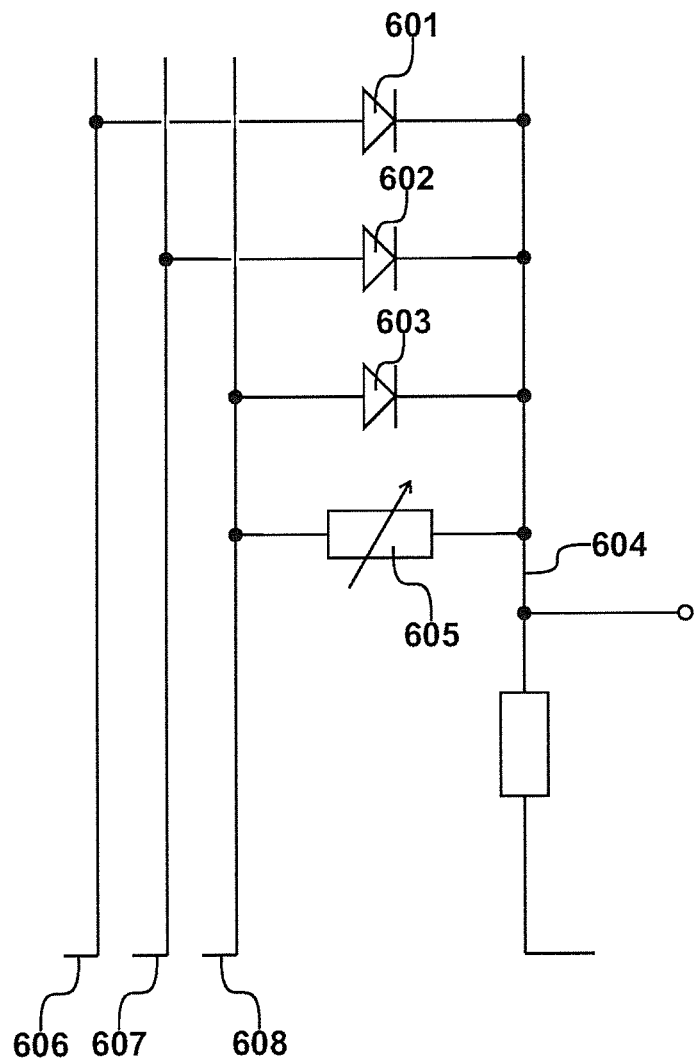
FIG. 6 illustrates an alternative embodiment.
Figure 7:
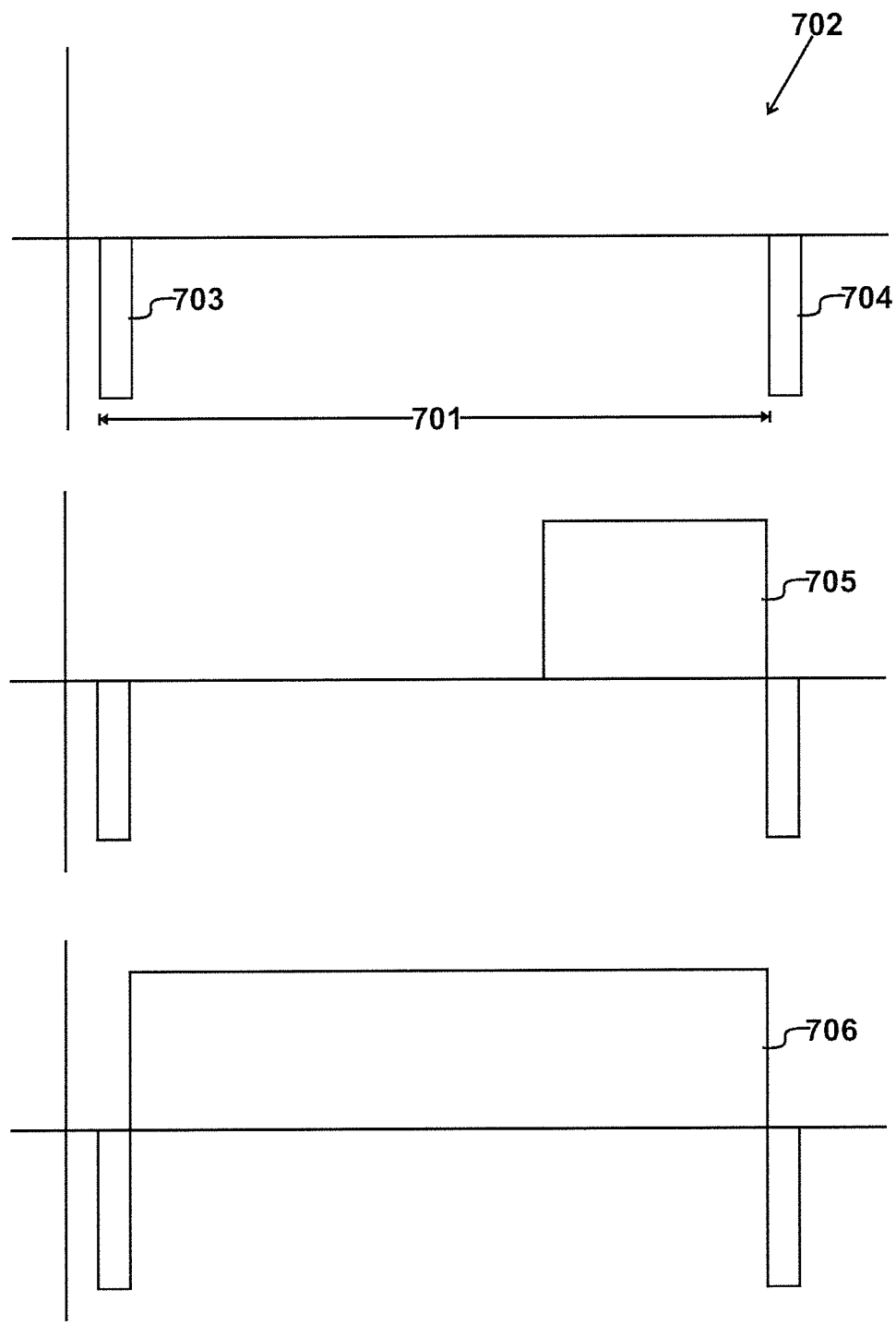
FIG. 7 illustrates timing diagrams.

In an alternative embodiment, as illustrated in FIG. 6, the individual light emitting devices of each cell (such as light emitting device 319 are replaced with a primary light-emitting diode 601, a secondary light-emitting diode 602 and a tertiary light-emitting diode 603 that, when driven, emit light of differing colors. In an embodiment, the primary light-emitting diode 601 emits red light, the secondary light-emitting diode 602 emits green light and the tertiary light-emitting diode 603 emits blue light.

A second electrical conductor 604 provides a connection to the cathode of each of the light emitting diodes 601 to 603, along with a connection to a pressure-sensitive element 605. Three electrical conductors of the first type are provided, consisting of a primary conductor 606, a secondary conductor 607 and a tertiary conductor 608. The anode of the primary light-emitting diode 601 is connected to the primary conductor 606. Thus, when a positive voltage is applied to the primary conductor 606, the primary light-emitting diode 601 is illuminated. Similarly, the anode of the secondary light-emitting diode 602 is connected to the secondary conductor 607. Consequently, the secondary light-emitting diode 602 (green) is illuminated when a positive voltage is applied to the secondary conductor 607. The anode of the tertiary light-emitting diode 603 (blue) is connected to the tertiary conductor 608. Consequently, when a positive voltage is applied to the tertiary conductor 608 the third light-emitting diode 603 is illuminated.

When a positive voltage is applied to the second electrical conductor 604, light emitting diodes 601 to 603 are reversed biased, therefore it is only possible for current to flow through the pressure-sensitive element 605, as previously described.

FIG. 7

Configurations described herein facilitate the deployment of a method of combining an illumination functionality with a touch sensing functionality. A first electrical conductor and a second electrical conductor are established on a substrate. A pressure-sensitive element is connected across the first electrical connector and the second electrical conductor. Additionally, a light-emitting device is connected between the first electrical conductor and the second electrical conductor. A control circuit then alternates between energizing the pressure-sensitive element with current flowing in a first direction and driving the light-emitting devices with current flowing in the opposite direction.

In an embodiment, sensing is performed periodically. In an example, switching occurs at ten hertz and the period 701 between samples is therefore one hundred milliseconds. However, in an embodiment, it is only necessary for the microcontroller 501 to scan the force sensor for a period of several microseconds. Consequently, the remaining duration of period 701 is available to provide illumination. Consequently, at full illumination, it is not possible for a human eye to detect that part of the illumination cycle is missing due to the pressure sensing operations that are being performed when current is flowing in the opposite (non-illuminating) direction.

In an embodiment, it would be possible for the pressure detection functionality of the illuminating device to be used to control any activity and need not necessarily be related to the illumination itself. However, in a deployment of the present invention, the pressure sensitivity is used to control the illumination of the device itself. Consequently, as illustrated at 702, the microcontroller 501 may initiate a process by energizing the pressure-sensitive elements, as indicated by negative pulses 703 and 704 but refrain from driving the light-emitting device, such that the light-emitting devices do not emit any light (they are off) and therefore do not consume any power. Furthermore, given that the pressure-sensitive devices are highly non-conductive before pressure is applied, monitoring is possible while again consuming very little power.

Upon pressure being applied, this will be sensed during one or more of the negative sampling periods such that, thereafter, the light-emitting devices may be driven, resulting in the generation of light. In an embodiment, it is possible that, after activation, the light-emitting devices enter a full light-emitting state, such that an illuminating voltage is presented throughout the full duration, except when the reverse scanning pulses 703, 704 are being deployed. The light-emitting devices could also remain on until an external power supply is removed.

In an alternative embodiment, the light-emitting devices remain on until a second application of pressure is detected such that, in response to this, the light-emitting devices are deactivated in a toggle-like fashion.

In a further alternative embodiment, a driving current is adjusted to increase an illumination level in response to additional pressure detection. Thus, in this way, it is possible for the driving current to be modified by a process of pulse-width-modulation.

In this example, after pressure has been detected, a positive pulse 705 is deployed during each period. Thereafter, in response to detecting a further application of pressure, the width of the driving pulse is increased from that shown at 705 to that shown at 706. Thus, in this example, two light levels are obtained but it should be appreciated that, in alternative embodiments, a greater number of increments may be provided.

Again, it is possible that after a maximum intensity has been reached, as indicated by pulse 706, the device could remain illuminated or could be switched off in response to receiving a further pulse. However, in an alternative embodiment, the driving current is adjusted to reduce the illumination level in response to additional pressure detection, after the illumination level has reached a maximum intensity. Thus, having reached an intensity indicated by pulse 706, a further application of pressure results in the driving current being reduced in length to the pulse shown at 705, whereafter a further application of pressure switches the illumination devices off as indicated at 702.

In an embodiment, the control circuit is configured to drive the light-emitting devices for a duration that is substantially longer than that during which the control-circuit energizes the pressure-sensitive elements. In an embodiment, the control circuit energizes the pressure-sensitive elements for less than two-per-cent (2%) and possibly less than one-per-cent (1%) of an operational period. The pressure-sensitive elements may be energized a plurality of times during a one-second interval and, in an embodiment of this type, the pressure-sensitive element is energized between eight and twelve times per second.

FIG. 8

Strips of the type described with reference to FIG. 3 may be used to construct a two-dimensional array, of the type illustrated in FIG. 8. This in turn presents a plurality of array locations, including a first array location 801, a second array location 802, a third array location 803 and a fourth array location 804. Thus, the example shown in FIG. 8 represents a 2×2 subsection of a much larger array having substantially more array locations.

Figure 8:
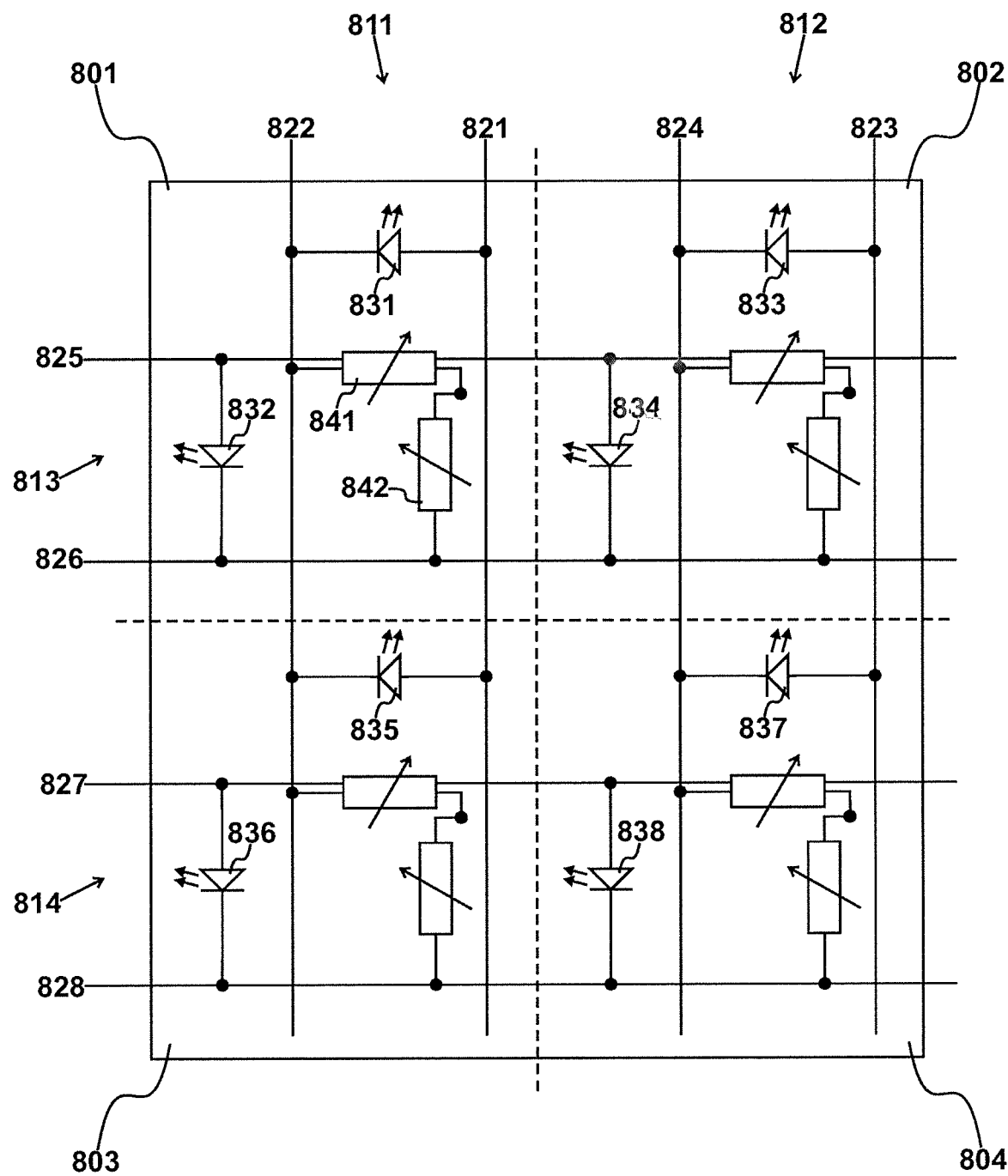
FIG. 8 illustrates a two-dimensional alternative embodiment.

In the example of FIG. 8, there is provided a first vertical strip 811, a second vertical strip 812, a first horizontal strip 813 and a second horizontal strip 814. Each strip (811 to 814) includes a first conductor 821, 823, 825, 827 respectively. Similarly, each strip (811 to 814) includes a second conductor 822, 824, 826, 828 respectively. A positive voltage is applied to the first conductors in order to illuminate the light-emitting devices. A positive voltage is supplied sequentially (in a time multiplexed fashion) to the second conductors 822, 824, 826, 828 to sample a selected sensing device.

Each array location includes a first light-emitting diode (831, 833, 835, 837) connected between respective first conductors (821, 823, 825, 827) and second conductors (822, 824, 826, 828). Each array location also includes a second light-emitting diode 832, 834, 836, 838 connected between respective horizontal first and second conductors.

Each array location is sensed sequentially. Thus, this process may be initiated by sensing the first array location 801, such that the remaining array locations illuminate. The second vertical strip 812 and the second horizontal strip 814 are not being sensed and are therefore illuminated. A positive voltage is applied to first conductor 823 resulting in the illumination of LED 833 and LED 837. A positive voltage is applied to first conductor 827 resulting in the illumination of LED 836 and LED 838. However, a positive voltage is not applied to first conductor 825 which is grounded.

Second conductor 826 provides an output signal. Instead of a positive voltage being applied to first conductor 821, a positive voltage is applied to the second conductor 822. This results in the energization of the first pressure-sensitive element 841 along with a series connected second pressure-sensitive element 842. Thus, when pressure is applied at the first array location 801, the first pressure-sensitive element 841 and the second pressure-sensitive element 842 become conductive, resulting in current flowing out through the second conductor 826 of the first horizontal strip 813. A voltage is then deleted across a reference resistor.

The invention claimed is:

1. An apparatus for providing illumination, comprising:
a substrate;
a first electrical conductor and a second electrical conductor supported by said substrate;
a pressure-sensitive element connected across said first electrical conductor and said second electrical conductor;
a light-emitting device connected between said first electrical conductor and said second electrical conductor; and
a control circuit configured to alternate between:
energizing said pressure-sensitive element by applying electricity to said pressure-sensitive element of a first polarity; and thereafter
driving said light-emitting device by applying electricity to said light-emitting device of a second-polarity, wherein said second polarity is opposite to said first polarity.

2. The apparatus of claim 1, wherein:
said pressure-sensitive element is a variable resistive element; and
said pressure-sensitive element is substantially non-conductive without an application of pressure.

3. The apparatus of claim 1, wherein:
said pressure-sensitive element presents a conductive resistance when pressure is applied;
said control circuit identifies said conductive resistance to identify a touch when energizing the pressure sensitive element; and
said light-emitting device presents a resistance substantially lower than said conductive resistance when being driven by said control circuit.

4. The apparatus of claim 1, wherein said light-emitting device is a light-emitting diode.

5. The apparatus of claim 4, including additional electrical conductors for supplying additional driving electricity to a multi-colored light-emitting device.

6. The apparatus of claim 1, wherein:
said pressure-sensitive element is connected in series with a diode; and
said diode prevents current-flow through said pressure-sensitive element when the control circuit drives said light-emitting device.

7. The apparatus of claim 1, wherein said control circuit is configured to drive said light-emitting device for a duration that is substantially longer than that during which said control circuit energizes said pressure sensitive-element.

8. The apparatus of claim 7, wherein said control circuit energizes said pressure-sensitive element for less than two per cent (2%) of an operational period.

9. The apparatus of claim 7, wherein said pressure-sensitive element is energized a plurality of times during a one-second interval.

10. The apparatus of claim 9, wherein said pressure-sensitive element is energized between eight and twelve times per second.

11. A method of combining an illumination functionality with a touch-sensing functionality, comprising the steps of:
establishing a first electrical conductor and a second electrical conductor on a substrate;
connecting a pressure-sensitive element across said first electrical conductor and said second electrical conductor;
connecting a light-emitting device between said first electrical conductor and said second electrical conductor; and
alternating, by means of a control-circuit, between:
energizing said pressure-sensitive element with current flowing in a first direction; and
driving said light-emitting device with current flowing in a direction opposite to said first direction.

12. The method of claim 11, wherein said driving step is performed in response to detecting pressure applied to said pressure-sensitive element.

13. The method of claim 11, wherein a driving current is adjusted to increase an illumination level in response to additional pressure detection.

14. The method of claim 13, wherein said driving current is modified by a process of pulse width modulation.

15. The method of claim 13, wherein said driving current is adjusted to reduce said illumination level in response to additional pressure detection, after said illumination level has reached a maximum intensity.

* * * * *